United States Patent
Shiga et al.

(10) Patent No.: US 8,274,846 B2
(45) Date of Patent: Sep. 25, 2012

(54) REFERENCE VOLTAGE GENERATION CIRCUIT AND SEMICONDUCTOR MEMORY

(75) Inventors: Hidehiro Shiga, Kamakura (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 12/652,612

(22) Filed: Jan. 5, 2010

(65) Prior Publication Data
US 2010/0172192 A1 Jul. 8, 2010

(30) Foreign Application Priority Data
Jan. 8, 2009 (JP) ................ 2009-002623

(51) Int. Cl.
*G11C 5/14* (2006.01)
(52) U.S. Cl. ............... 365/189.09; 365/49.13; 365/145; 365/149; 365/189.07; 365/202; 365/203; 365/210.1; 365/210.12; 365/210.15; 365/211
(58) Field of Classification Search .............. 365/49.13, 365/145, 149, 189.07, 189.09, 202, 203, 365/210.1, 210.12, 210.15, 211
See application file for complete search history.

(56) References Cited

U.S. PATENT DOCUMENTS
6,574,133 B2  6/2003  Takashima
2006/0202668 A1 * 9/2006 Tran et al. ............... 323/215
2008/0084730 A1 * 4/2008 Hoya et al. .............. 365/145
2009/0195306 A1 * 8/2009 Chen et al. .............. 330/9

OTHER PUBLICATIONS

D. Takashima et al., "A 76-mm$^2$ 8-Mb Chain Ferroelectric Memory" IEEE Journal of Solid-State Circuits, vol. 36, No. 11, pp. 1713-1720, Nov. 2001.
Background Art Information.
Okuma, et al. ,"0.5-V Input Digital LDO with 98.7% Current Efficiency and 2.7-μA Quiescent Current in 65nm CMOS," Custom Integrated Circuits Conference (CICC), 2010 IEEE, in 4 pages.

* cited by examiner

*Primary Examiner* — Fernando Hidalgo
(74) *Attorney, Agent, or Firm* — Knobbe, Martens, Olson & Bear, LLP

(57) ABSTRACT

A reference voltage generation circuit includes a first node settable at a reference voltage to be any one of a plurality of voltage levels, a second node set at a pre-charge voltage, first and second switches connected in series between the first and second nodes, a plurality of capacitors, each capacitor comprising a first end connected to a connection node between the first and second switches and a second end settable at an independent voltage level, a switch controller configured to turn off the first switch and turn on the second switch in an initial state, and then to turn off the second switch, and then to turn on the first switch, and a voltage controller configured to individually set a voltage at the second end of each capacitor after the first switch is turned on.

20 Claims, 7 Drawing Sheets

| TERMINAL / TRIMMING LEVEL | A0 | A1 | A2 | A3 | |
|---|---|---|---|---|---|
| (a) +7 | GND→Vint | GND→Vint | GND→Vint | KEEPING GND OR Vint | +1+2+4 |
| (b) | Vint→GND | KEEPING GND OR Vint | KEEPING GND OR Vint | GND→Vint | −1+8 |
| (c) | GND→Vint | Vint→GND | KEEPING GND OR Vint | GND→Vint | +1−2+8 |
| (d) | GND→Vint | GND→Vint | Vint→GND | GND→Vint | +1+2−4+8 |

FIG.5

| TRIMMING LEVEL \ TERMINAL | A0 | A1 | A2 | A3 |
|---|---|---|---|---|
| +8 | KEEPING GND OR Vint | KEEPING GND OR Vint | KEEPING GND OR Vint | GND→Vint |

FIG.7

| TEMPERATURE | V00 | V01 | V10 | V11 | V20 | V21 | V30 | V31 |
|---|---|---|---|---|---|---|---|---|
| REFERENCE TEMPERATURE OR LOWER | Vint | GND | GND | GND | GND | GND | GND | Vint |
| REFERENCE TEMPERATURE OR HIGHER | GND | GND | GND | GND | GND | GND | GND | Vint |

FIG.8

REFERENCE VOLTAGE GENERATION CIRCUIT AND SEMICONDUCTOR MEMORY

CROSS-REFERENCE TO RELATED APPLICATION

This application is based upon and claims the benefit of priority from the prior Japanese Patent Application No. 2009-2623, filed on Jan. 8, 2009; the entire contents of which are incorporated herein by reference.

BACKGROUND OF THE INVENTION

1. Field of the Invention

The present invention relates to a reference voltage generation circuit generating a reference voltage and a semiconductor memory including the reference voltage generation circuit.

2. Related Art

In order to read out information stored in a ferroelectric memory or the like, a sense amplifier compares a voltage read out from a memory cell to a bit line with a voltage (reference voltage) of a reference bit line to sense a voltage difference between both voltages. For example, the sense amplifier determines to be "HIGH" when the voltage read out to the bit line is higher than the reference voltage and determines to be "LOW" when the voltage read out to the bit line is lower than the reference voltage. It is necessary to provide a circuit for generating an appropriate reference voltage in order to conduct a correct sense operation.

D. Takashima et al., "A 76 mm2 8 Mb chain Ferroelectric memory" (IEEE J. solid-state circuits, Vol. 36, No. 11, pp. 1713-1720, November 2001.) discloses a reference voltage generation circuit which adjusts a voltage $V_{dc}$ at one end of a capacitor to control a voltage level of the reference bit line.

However, in the above document, it is necessary to provide another power circuit in order to adjust the voltage $V_{dc}$. This causes to increase an area of the circuit.

BRIEF SUMMARY OF THE INVENTION

According to a first aspect of the present invention, a reference voltage generation circuit comprises a first node settable at a reference voltage to be any one of a plurality of voltage levels, a second node configured to be set at a precharge voltage, first and second switches connected in series between the first and second nodes, a plurality of capacitors, each capacitor comprising a first end connected to a connection node between the first and second switches and a second end settable at an independent voltage level, a switch controller configured to turn off the first switch and turn on the second switch in an initial state, and then to turn off the second switch and to turn on the first switch, and a voltage controller configured to individually set a voltage at the second end of each capacitor after the first switch is turned on.

According to a second aspect of the present invention, a semiconductor memory comprises a memory cell, a bit line connected to the memory cell, a reference bit line, a reference voltage generation circuit configured to generate a reference voltage applied to the reference bit line, and a sense amplifier configured to compare a voltage of the bit line with the reference voltage to sense data read out from the memory cell via the bit line. The reference voltage generation circuit comprises a first node settable at a reference voltage to be any one of a plurality of voltage levels, a second node set at a precharge voltage, first and second switches connected in series between the first and second nodes, a plurality of capacitors, each capacitor comprising a first end connected to a connection node between the first and second switches and a second end settable at an independent voltage level, a switch controller configured to turn off the first switch and turn on the second switch in an initial state, and then to turn off the second switch and to turn on the first switch, and a voltage controller configured to individually set a voltage at the second end of each capacitor after the first switch is turned on.

BRIEF DESCRIPTION OF THE DRAWINGS

FIG. 5 is a table showing four kinds of voltage setting manners.

FIG. 7 illustrates the voltage setting manner to generate the "trimming level +8".

FIG. 8 illustrates that the voltage controller 19 sets the voltages $V_0$ to $V_3$ at the output terminals A0 to A3 using the look up table manner.

DETAILED DESCRIPTION OF THE EMBODIMENTS

Embodiments of a reference voltage generation circuit and a semiconductor memory including the reference voltage generation circuit of the present invention will be described below, with reference to the accompanying drawings. The reference voltage generation circuit used for a ferroelectric memory is mainly described below. However, the reference voltage generation circuit of the present invention is applicable to various types of semiconductor memories other than the ferroelectric memory.

First Embodiment

Figure 1:
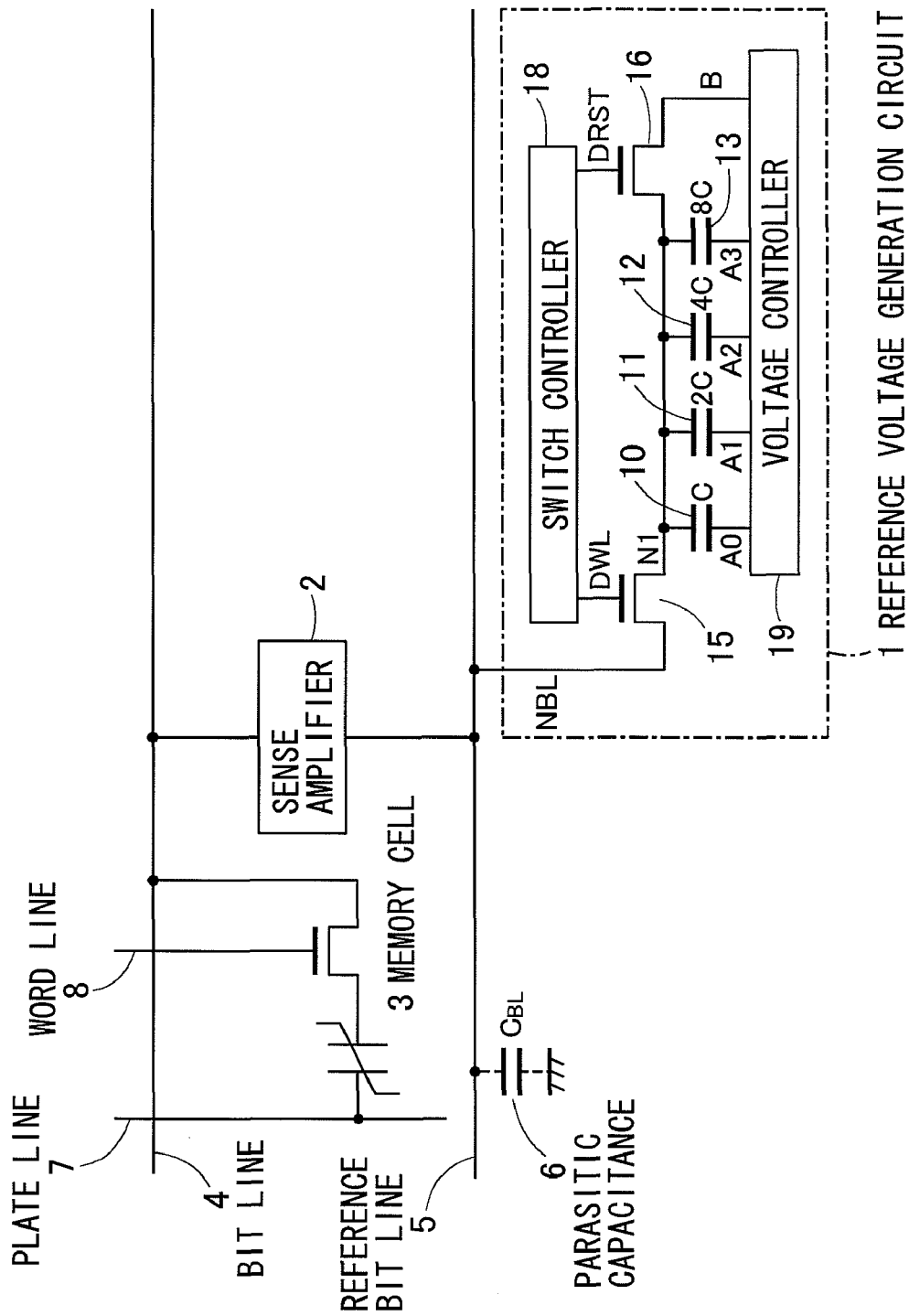
FIG. 1 illustrates a drawing showing a schematic configuration of a ferroelectric memory including a reference voltage generation circuit 1 according to a first embodiment of the present invention.

FIG. 1 illustrates a drawing showing a schematic configuration of a ferroelectric memory including a reference voltage generation circuit 1 according to a first embodiment of the present invention.

The ferroelectric memory of FIG. 1 includes the reference voltage generation circuit 1, a sense amplifier 2, a ferroelectric memory cell (hereinafter, referred to as "memory cell") 3, a bit line 4, a reference bit line 5, a plate line 7, and a word line 8.

In principle, an operation principle of the ferroelectric memory is similar to that of a DRAM (Dynamic Random Access Memory). In writing, the word line 8 is activated to store electrical charges in the memory cell 3 on the basis of a voltage of the bit line 4. In reading, the voltage of the bit line 4 is changed on the basis of the electrical charges stored in the memory cell 3. The sense amplifier 2 compares the voltage of the bit line 4 in reading with a voltage of the reference bit line 5 generated by the reference voltage generation circuit 1, to sense a difference between both voltages.

The reference voltage generation circuit 1 includes a first node NBL, a second node B, a first transistor (a first switch) 15, a second transistor (a second switch) 16, capacitors 10 to 13, a switch controller 18, and a voltage controller 19. It is assumed that a parasitic capacitance 6 having capacitance $C_{BL}$ parasitizes the first node NBL.

The first node NBL corresponds to the reference bit line 5 set at the reference voltage which is any one of a plurality of voltage levels. The second node B is set at a predetermined pre-charge voltage. The first and second transistors 15 and 16 are connected in cascade between the first and second nodes NBL and B.

Each one end (first end) of the capacitors 10 to 13 is connected to a connection node (hereinafter, referred to as "third node") N1 between the first and second transistors 15 and 16. The other ends (second ends) of the capacitors 10 to 13 correspond to output terminals A0 to A3, respectively, and the output terminals A0 to A3 are settable to voltages different from each other by the voltage controller 19. FIG. 1 shows an example having four capacitors 10 to 13 whose capacitances are C, 2C, 4C, and 8C, respectively. However, there is no limitation to the number of the capacitors and the capacitances thereof.

The switch controller 18 controls switching of ON and OFF of the first and second transistors 15 and 16. More specifically, the switch controller 18 turns off the first transistor 15 and turns on the second transistor 16 in an initial state, and then turns off the second transistor 16, and then turns on the first transistor 15.

The pre-charge voltage is applied to an output terminal B corresponding to one end of the second transistor 16 from the voltage controller 19. In the initial state, since the second transistor 16 is turned on, the pre-charge voltage is pre-charged to the third node N1. In the initial state, the voltage controller 19 sets voltages $V_0$ to $V_3$ at the output terminals A0 to A3 to be 0 [V]. Therefore, the electrical charges corresponding to the pre-charge voltage are stored in the capacitors 10 to 13, respectively.

After the second transistor 16 is turned off and the first transistor 15 is turned on, the voltage controller 19 individually sets voltages $V_0$ to $V_3$ at the output terminals A0 to A3. As a result, due to capacitance coupling of the capacitors 10 to 13, a voltage $V_{N1}$ at the third node N1 is changed on the basis of the voltages $V_0$ to $V_3$ at the output terminals A0 to A3. That is, the voltage controller 19 can control the voltages $V_0$ to $V_3$ at the output terminals A0 to A3 to adjust the voltage $V_{N1}$ at the third node N1.

For example, the voltage controller 19 can set the voltage applied to the output terminals A0 to A3 and B, to be $V_{int}$ or GND (0 [V]). The switch controller 18 applies $V_{pp}$ or GND (0 [V]) to terminals DWL and DRST in order to turn on and off of the first and second transistors 15 and 16.

$V_{int}$ and $V_{pp}$ are fixed voltages. It is assumed that $V_{pp}$ is higher than a sum of $V_{int}$ and a threshold voltage $V_{TH}$ of the first and second transistors 15 and 16. $V_{int}$ and $V_{pp}$ may be generated inside the memory or applied from outside of the memory. For example, $V_{int}$=1.5 [V] and $V_{pp}$=3.3 [V]. However, there is no limitation to voltage levels of $V_{int}$ and $V_{pp}$.

The first embodiment of the present invention shows an example that the first and second transistors 15 and 16 are NMOS (N-channel Metal Oxide Semiconductor) transistors. PMOS (P-channel Metal Oxide Semiconductor) transistors or bipolar transistors are applicable as the first and second transistors 15 and 16.

Figure 2:
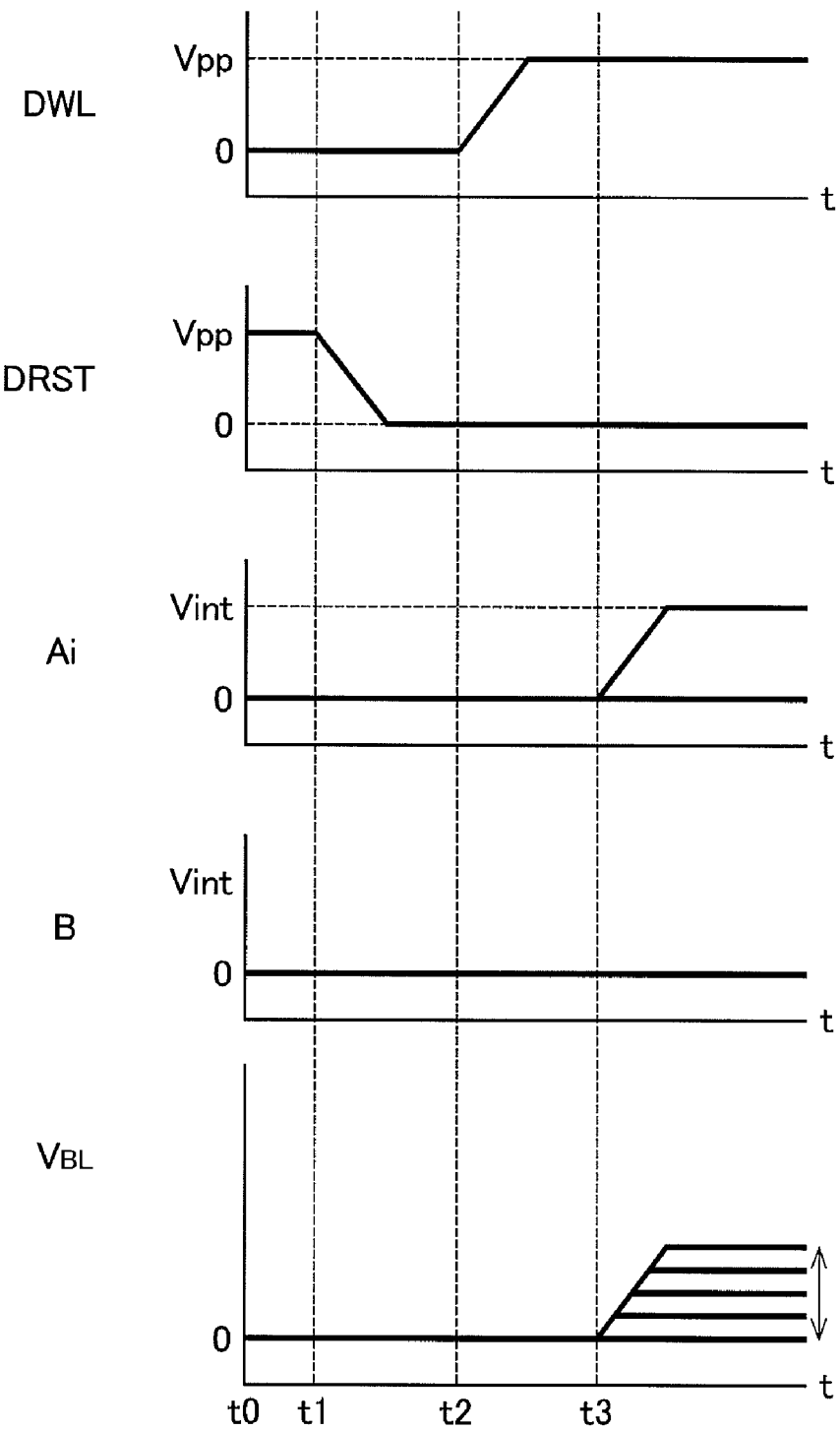
FIG. 2 is a drawing showing voltage waveforms regarding an example of an operation of the reference voltage generation circuit 1.

FIG. 2 is a drawing showing voltage waveforms regarding an example of an operation of the reference voltage generation circuit 1. In FIG. 2, lateral axes show a time and vertical axes show a voltage level at each part. The operation of the reference voltage generation circuit 1 according to the first embodiment of the present invention will be described below, with reference to FIG. 2.

Firstly, in the initial state, it is assumed that a voltage $V_{BL}$ at the first node NBL is 0 [V]. The switch controller 18 sets a voltage $V_{DWL}$ at the terminal DWL to be 0 [V] and a voltage $V_{DRST}$ at the terminal DRST to be $V_{pp}$. Therefore, the second transistor 16 is turned on, and the third node N1 and the second node B are electrically conducted. On the other hand, the first transistor 15 is turned off, and the third node N1 and the first node NBL are separated.

Furthermore, in the initial state, the voltage controller 19 sets $V_i$ (i=0 to 3)=0 [V] and $V_B$=0 [V]. Because the second transistor 16 is turned on, the voltage $V_{N1}$ at the third node N1 becomes equal to the voltage $V_B$ at the second node B, which is 0 [V].

Next, the switch controller 18 sets the voltage $V_{DRST}$ at the terminal DRST to be 0 [V] at time t1. As a result, the second transistor 16 is turned off, and the third node N1 and the second node B are separated. After that, the switch controller 18 sets the voltage $V_{DWL}$ at the terminal DWL to be $V_{pp}$ at time t2. As a result, the first transistor 15 is turned on, and the third node N1 and the first node NBL are electrically conducted. At this time, the voltage $V_{N1}$ at the third node N1 is 0 [V]. Therefore, the voltage $V_{BL}$ at the first node NBL keeps 0 [V].

Furthermore, the voltage controller 19 sets a voltage at any one terminal among the output terminals A0 to A3 to be $V_{int}$ at time t3. When the voltage at the output terminal Ai is $V_i$ (i=0 to 3, $V_i$=0 [V] or $V_{int}$), the following formula (1) is established, due to a law of conservation of charge.

$$0 = C_{BL}*V_{BL} + C(V_{BL}-V_0) + 2C(V_{BL}-V_1) + 4C(V_{BL}-V_2) + 8C(V_{BL}-V_3) \quad (1)$$

The voltage $V_{BL}$ at the first node NBL is represented by the following formula (2) by modifying the formula (1).

$$V_{BL} = C(V_0 + 2V_1 + 4V_2 + 8V_3)/(C_{BL} + 15C) \quad (2)$$

When the voltages $V_0$ to $V_3$ at the output terminals A0 to A3 keep 0 [V] ($V_0$=$V_1$=$V_2$=$V_3$=0 [V]), the voltage $V_{BL}$ at the first node NBL becomes a minimum value ($V_{BL}$=0 [V]). When the voltages $V_0$ to $V_3$ at the output terminals A0 to A3 are set to $V_{int}$ ($V_0$=$V_1$=$V_2$=$V_3$=$V_{int}$), the voltage $V_{BL}$ at the first node NBL becomes a maximum value ($V_{BL}$=15C*$V_{int}$/($C_{BL}$+15C)).

Furthermore, a ratio of the capacitances of the capacitors 10 to 13 is 1:2:4:8. Therefore, the voltage $V_{BL}$ at the first node NBL in the formula (2) can be any one of 16 kinds of voltages obtained by equally dividing between the minimum value and the maximum value into 15 (the numerator in the right hand side of the formula (2)=0, (C*$V_{int}$), (2C*$V_{int}$), . . . , (15C*$V_{int}$)).

As above, the voltage controller 19 sets $V_i$=0 [V] and $V_B$=0 [V] in the initial state (at time t0), and then arbitrarily selects any one of the voltages $V_0$ to $V_3$ at the output terminals A0 to A3 to set the selected voltage to be $V_{int}$ at time t3. Therefore, it is possible to generate any one voltage among the 16 kinds of voltages obtained by equally dividing voltage levels from 0 to {15C*$V_{int}$/($C_{BL}$+15C)} into 15 as the voltage $V_{BL}$ at the first node NBL.

Figure 3:
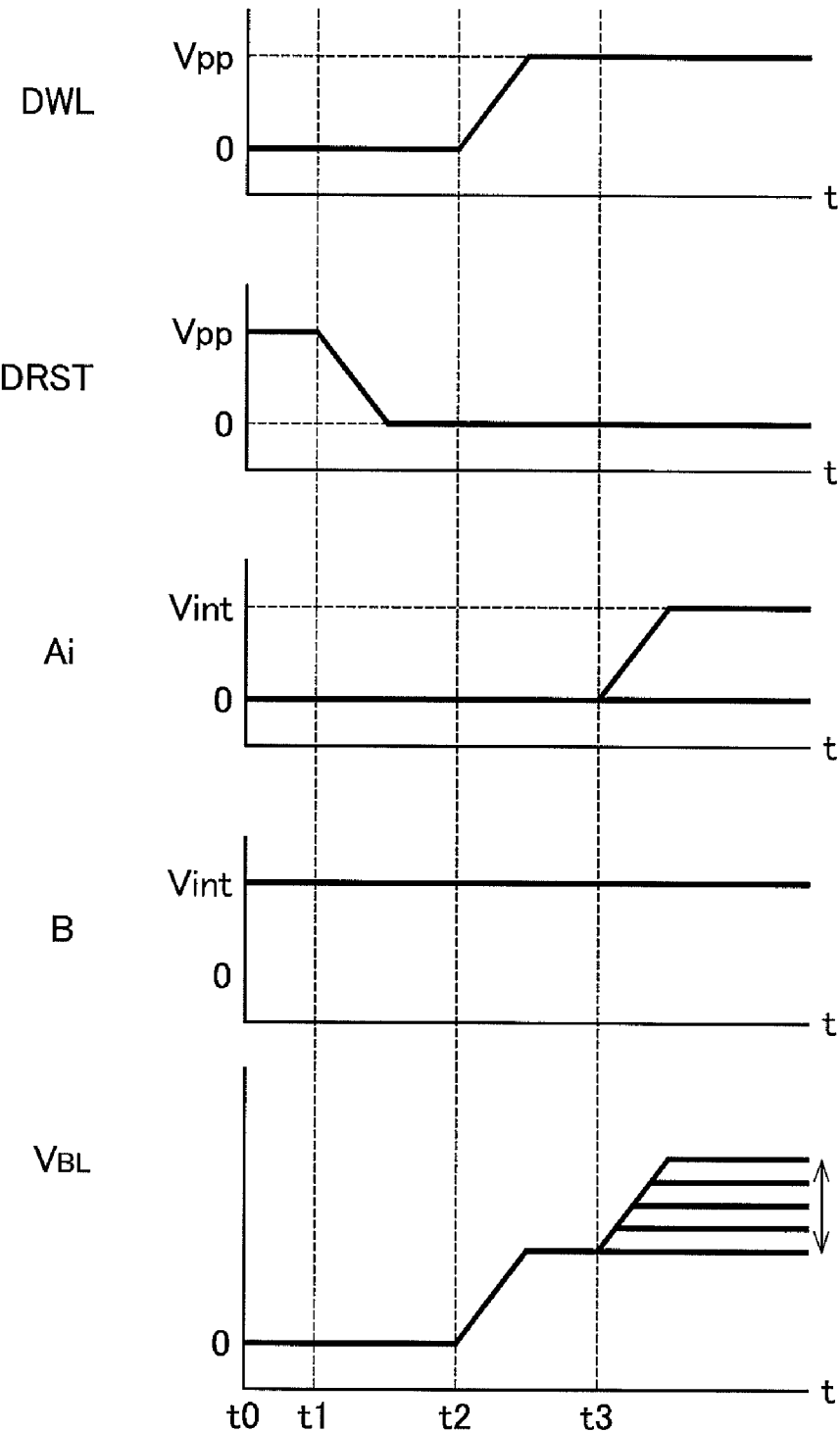
FIG. 3 is a drawing showing voltage waveforms regarding an example of an operation of the reference voltage generation circuit 1.

FIG. 3 is a drawing showing voltage waveforms regarding an example of an operation of the reference voltage generation circuit 1. Lateral and vertical axes of FIG. 3 are the same as those of FIG. 2. FIG. 2 illustrates an example that the voltage controller 19 sets $V_i=0$ [V] and $V_B=0$ [V] in initial state (at time t0). However, FIG. 3 illustrates an example that the voltage controller 19 sets $V_i=0$ [V] and $V_B=V_{int}$ in initial state.

Firstly, in the initial state, it is assumed that the voltage $V_{BL}$ at the first node NBL is 0 [V]. The switch controller 18 sets the voltage $V_{DWL}$ at the terminal DWL to be 0 [V] and the voltage $V_{DRST}$ at the terminal DRST to be $V_{pp}$. As a result, the second transistor 16 is turned on, and the third node N1 and the second node B are electrically conducted. On the other hand, the first transistor 15 is turned off, and the third node N1 and the first node NBL are separated.

Furthermore, in the initial state, the voltage controller 19 sets $V_i$ (i=0 to 3)=0 [V] and $V_B=V_{int}$ [V]. Because the second transistor 16 is turned on, the voltage $V_{N1}$ at the third node N1 becomes equal to the voltage $V_B$ at the second node B, which is $V_{int}$. The capacitors 10 to 13 stores electrical charges which are $(C^*V_{int})$, $(2C^*V_{int})$, $(4C^*V_{int})$, and $(8C^*V_{int})$, respectively. A sum of the electrical charges stored in the capacitors 10 to 13 is $(15C^*V_{int})$.

Next, the switch controller 18 sets the voltage $V_{DRST}$ of the terminal DRST to be 0 [V] at time t1. As a result, the second transistor 16 is turned off, and the third node N1 and the second node B are separated. After that, the switch controller 18 sets the voltage $V_{DWL}$ at the terminal DWL to be $V_{pp}$ at time t2. As a result, the first transistor 15 is turned on, and the third node N1 and the first node NBL are electrically conducted. At this time, the electrical charges stored at time t1, which are $(15C^*V_{int})$, is redistributed to the capacitors 10 to 13 and the parasitic capacitance 6. Therefore, the following formula (3) is established.

$$15C^*V_{int}=(C_{BL}+C+2C+4C+8C)V_{BL} \quad (3)$$

Accordingly, the voltage $V_{BL}$ at the first node NBL is represented by the following formula (4).

$$V_{BL}=15C^*V_{int}/(C_{BL}+15C) \quad (4)$$

Furthermore, the voltage controller 19 sets any one of the voltages $V_0$ to $V_3$ at the output terminals A0 to A3 to be $V_{int}$ at time t3. When the voltage at the output terminal Ai is $V_i$ (i=0 to 3, $V_i=0$ [V] or $V_{int}$), the following formula (5) is established because a sum of the electrical charges stored in the third node N1 is $(15C^*V_{int})$, as above.

$$15C*V_{int} = C_{BL}*V_{BL} + C(V_{BL} - V_0) + \\ 2C(V_{BL} - V_1) + 4C(V_{BL} - V_2) + 8C(V_{BL} - V_3) \quad (5)$$

Accordingly, the voltage $V_{BL}$ at the first node NBL is represented by the following formula (6).

$$V_{BL}=C(15V_{int}+V_0+2V_1+4V_2+8V_3)/(C_{BL}+15C) \quad (6)$$

When the voltages $V_0$ to $V_3$ at the output terminals A0 to A3 keep 0 [V] ($V_0=V_1=V_2=V_3=0$ [V]), the voltage $V_{BL}$ at the first node NBL becomes a minimum value, ($V_{BL}=15C^*V_{int}/(C_{BL}+15C)$). When the voltages $V_0$ to $V_3$ at the output terminals A0 to A3 are set to $V_{int}$ ($V_0=V_1=V_2=V_3=V_{int}$), the voltage $V_{BL}$ at the first node NBL becomes a maximum value, $V_{BL}=30C^*V_{int}/(C_{BL}+15C)$.

Furthermore, a ratio of the capacitances of the capacitors 10 to 13 is 1:2:4:8. Therefore, the voltage $V_{BL}$ at the first node NBL in the formula (6) can be any one voltage among 16 kinds of voltages obtained by equally dividing between the minimum value and the maximum value into 15 (the numerator in the right hand side of the formula (6)=$(15C^*V_{int})$, $(16C^*V_{int})$, $(17C^*V_{int})$, ..., $(30C^*V_{int})$).

As above, the voltage controller 19 sets $V_i=0$ [V] and $V_B=V_{int}$ in the initial state (at time t0), and then arbitrarily selects any one of the voltages $V_0$ to $V_3$ at the output terminals A0 to A3 to set the selected one to be $V_{int}$ at time t3. Therefore, it is possible to generate any one voltage among 16 kinds of voltages obtained by equally dividing voltage levels from $\{15C^*V_{int}/(C_{BL}+15C)\}$ to $\{30C^*V_{int}/(C_{BL}+15C)\}$ into 15 as the voltage $V_{BL}$ first node NBL.

Alternatively, the voltage $V_B$ at the second node B may be set so that the voltage controller 19 can set the pre-charge voltage. Otherwise, the voltage $V_B$ may be fixed to a predetermined voltage level. Even in this case, the operation of FIG. 3 is feasible when the voltage $V_B$ at the second node B is fixed to $V_{int}$, and the operation of FIG. 2 is feasible when the voltage $V_B$ at the second node B is fixed to 0 [V].

In FIG. 1, if there is no second transistor 16, the voltage $V_{BL}$ at the first node NBL can be variably adjusted only in a voltage range shown in FIG. 2 and the formula (2). A variable range of the voltage $V_{BL}$ is small, and selectable voltage levels are limited to 16 levels or less. On the other hand, as described in the first embodiment of the present invention, if there is the second transistor 16, the voltage $V_{BL}$ can be set in the high voltage range shown in FIG. 3. If there is no second transistor 16, capacitances of the capacitors 10 to 13 have to be enlarged in order to acquire the high voltage range shown in FIG. 3, thereby increasing an area of a circuit. However, by providing the second transistor 16, the voltage $V_{BL}$ at the first node NBL can be set at high value without increasing the area of the circuit.

Furthermore, the voltage controller 19 can arbitrarily set the voltage $V_B$ at the second node B to be 0 [V] or $V_{int}$. In this case, the voltage $V_{BL}$ at the first node NBL can be set in 31 kinds of wide voltage ranges, 31 including a low voltage range shown in FIG. 2 and a high voltage range shown in FIG. 3. Therefore, the reference voltage at the first node NBL can be set to an optimal value in accordance with a property of the memory cell 3.

Second Embodiment

In the first embodiment of the present invention, a voltage setting manner of the voltage controller 19 has only one manner for setting the first node NBL to be a predetermined voltage level. On the other hand, in a second embodiment of the present invention, the voltage controller 19 can arbitrarily set any one of the voltages $V_0$ to $V_3$ at the output terminals A0 to A3 even in the initial state, and the voltage controller 19 has multiple voltage setting manners for setting the first node NBL to be the predetermined voltage level. That is, the voltage setting manners according to the second embodiment have redundancy.

Figure 4:
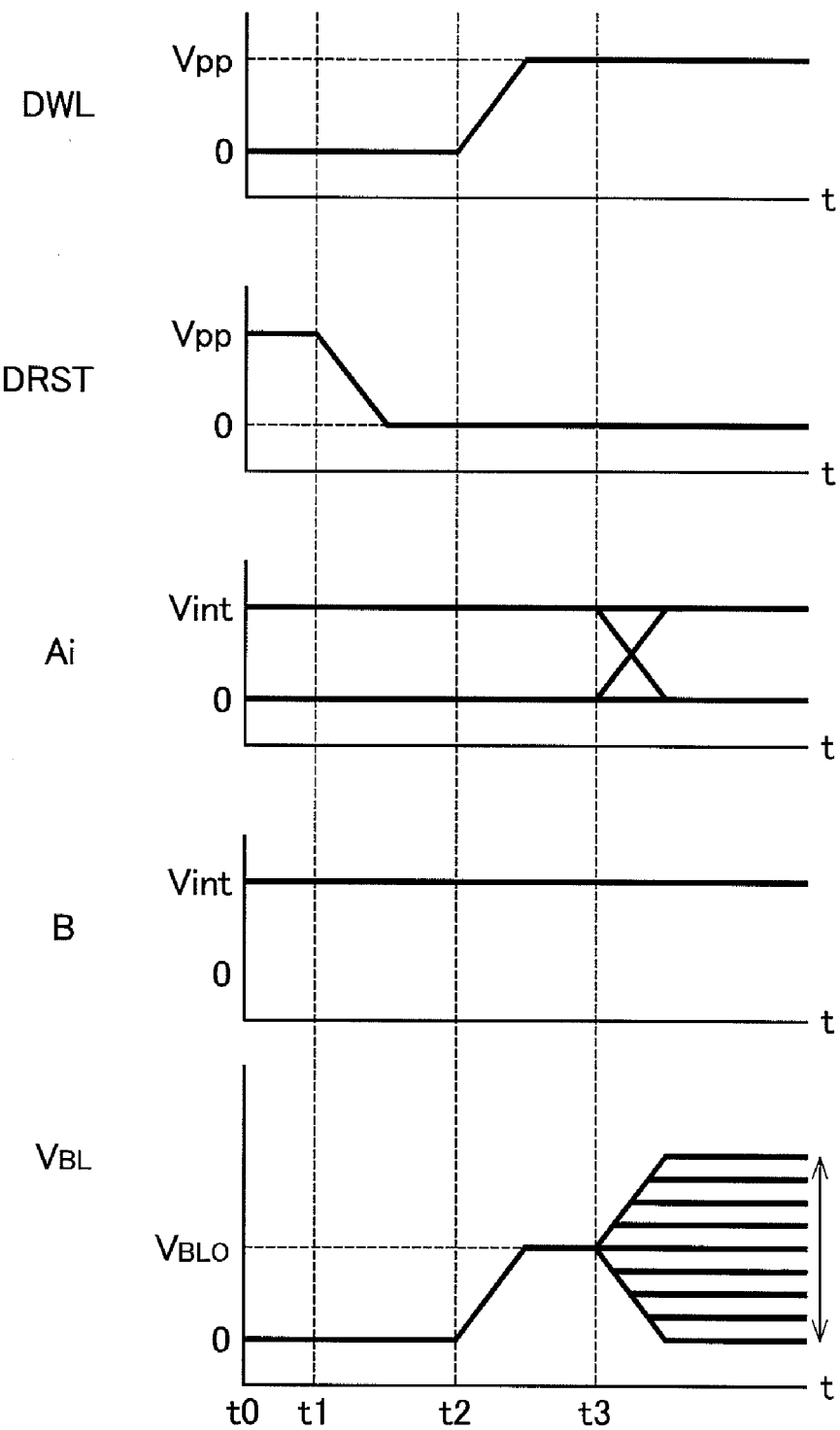
FIG. 4 is a drawing of voltage waveforms regarding an example of an operation of the reference voltage generation circuit 1.

FIG. 4 is a drawing of voltage waveforms regarding an example of an operation of the reference voltage generation circuit 1. Lateral and vertical axes of FIG. 4 are the same as those of FIG. 2. FIGS. 2 and 3 show examples that the voltage controller 19 sets $V_i=0$ [V] in initial state (at time t0). However, FIG. 4 shows an example that the voltage controller 19 sets $V_i=0$ [V] or $V_{int}$ in initial state.

Firstly, in the initial state, it is assumed that the voltage $V_{BL}$ at the first node NBL is 0 [V]. The switch controller 18 sets the voltage $V_{DWL}$ at the terminal DWL to be 0 [V] and the voltage $V_{DRST}$ at the terminal DRST to be $V_{pp}$. As a result, the second transistor 16 is turned on, and the third node N1 and the second node B are electrically conducted. On the other hand, the first transistor 15 is turned off, and the third node N1 and the first node NBL are separated.

Furthermore, in the initial state, the voltage controller 19 can individually set the voltage $V_i$ (i=0 to 3) at the output terminal Ai. For example, the voltage controller 19 sets $V_i=0$ [V] or $V_{int}$, and $V_B=V_{int}$. Because the second transistor 16 is turned on, the voltage $V_{N1}$ of the third node N1 is the same as the voltage $V_B$ of the second node B, which is $V_{int}$.

When the voltage of the output terminal Ai is $V_{i0}$ (i=0 to 3, $V_{i0}=0$ [V] or $V_{int}$) in the initial state, the capacitors 10 to 13 store the electrical charges which are $\{C*(V_{int}-V_{00})\}$, $\{2C*(V_{int}-V_{10})\}$, $\{4C*(V_{int}-V_{20})\}$, and $\{8C*(V_{int}-V_{30})\}$, respectively. A sum of the electrical charges stored in the capacitors 10 to 13 is $\{C(15V_{int}-V_{00}-2V_{10}-4V_{20}-8V_{30})\}$.

Next, the switch controller 18 sets the voltage $V_{DRST}$ at the terminal DRST to be 0 [V] at time t1. As a result, the second transistor 16 is turned off, and the third node N1 and the second node B are separated. After that, the switch controller 18 sets the voltage $V_{DWL}$ at the terminal DWL to be $V_{pp}$ at time t2. As a result, the first transistor 15 is turned on, and the third node N1 and the first node NBL are electrically conducted. At this time, the electrical charges stored at time t1, which are $\{C(15V_{int}-V_{00}-2V_{10}-4V_{20}-8V_{30})\}$, is redistributed to the capacitors 10 to 13 and the parasitic capacitance 6. When the voltage at the first node NBL is $V_{BL0}$, the following formula (7) is established.

$$C(15V_{int} - V_{00} - 2V_{10} - 4V_{20} - 8V_{30}) = \\ C_{BL}*V_{BL0} + C(V_{BL0}-V_{00}) + 2C(V_{BL0}-V_{10}) + 4C(V_{BL0}-V_{20}) \\ + 8C(V_{BL0}-V_{30}) \quad (7)$$

Accordingly, the voltage $V_{BL0}$ of the first node NBL is represented by the following formula (8).

$$V_{BL0} = 15C*V_{int}/(C_{BL}+15C) \quad (8)$$

Furthermore, the voltage controller 19 sets any one of the voltages $V_0$ to $V_3$ at the output terminals A0 to A3 to be 0 [V] or $V_{int}$ at time t3. When the voltage at the output terminal Ai is $V_{i1}$ (i=0 to 3, $V_{i1}=0$ [V] or $V_{int}$) and the voltage at the first node NBL is $V_{BL1}$, the electrical charges which are $\{C(15*V_{int}-V_{00}-2V_{10}-4V_{20}-8V_{30})\}$ are stored in the third node N1. Therefore, the following formula (9) is established.

$$C(15*Vint - V_{00} - 2V_{10} - 4V_{20} - 8V_{30}) = C_{BL}*V_{BL1} + \\ C(V_{BL1}-V_{01}) + 2C(V_{BL1}-V_{11}) + 4C(V_{BL1}-V_{21}) + 8C(V_{BL1}-V_{31}) \quad (9)$$

Accordingly, the voltage $V_{BL1}$ at the first node NBL is represented by the following formula (10).

$$V_{BL1} = C\{15Vint+(V_{01}-V_{00})+2(V_{11}-V_{10})+4(V_{21}-V_{20})+8(V_{31}-V_{30})\}/(C_{BL}+15C) \quad (10)$$

When the $V_{00}=V_{10}=V_{20}=V_{30}=V_{int}$ and the $V_{01}=V_{11}=V_{21}=V_{31}=0$ [V], the voltage $V_{BL1}$ at the first node NBL is minimum value which is 0 [V]. When the $V_{00}=V_{10}=V_{20}=V_{30}=0$ [V] and the $V_{01}=V_{11}=V_{21}=V_{31}=V_{int}$, the voltage $V_{BL1}$ at the first node NBL is a maximum value which is $\{30C*V_{int}/(C_{BL}+15C)\}$.

In the first embodiment of the present invention, the relation between the voltages $V_0$ to $V_3$ at the output terminals A0 to A3 set by the voltage controller 19 and the voltage $V_{BL}$ at the first node NBL is a one-on-one relationship. Therefore, when the voltages $V_0$ to $V_3$ at the output terminals $A_0$ to $A_3$ are changed, the voltage $V_{BL}$ at the first node NBL is also changed. On the other hand, in the second embodiment of the present invention, even if the voltages $V_0$ to $V_3$ at the output terminals A0 to A3 are changed, the voltage $V_{BL1}$ at the first node $N_{BL}$ is not necessarily changed. In other words, the voltage controller 19 may have multiple voltage setting manners to set the first node NBL to be the predetermined voltage level. In this way, the voltage controller 19 according to the second embodiment of the present invention has redundancy in the voltage setting manners.

This redundancy will be described in detail below. For example, it is assumed that the voltage controller 19 sets the voltages $V_0$ to $V_2$ at the output terminals A0 to A2 to be 0 [V] ($V_{00}=V_{10}=V_{20}=0$ [V]) in the initial state, sets the voltages $V_0$ to $V_2$ at the output terminals A0 to A2 to be $V_{int}$ ($V_{01}=V_{11}=V_{21}=V_{int}$) at time t3, and sets the voltage $V_3$ at the output terminal A3 to be a fixed voltage ($V_{30}=V_{31}=0$ [V] or $V_{30}=V_{31}=V_{int}$). In this case, the voltage $V_{BL1}$ at the first node NBL is expressed by $\{V_{BL1}=V_{BL0}+7C*V_{int}/(C_{BL}+15C)\}$ on the basis of the formulas (8) and (10).

There are four manners of setting the first node NBL to be the above voltage $V_{BL1}$, including the above setting manners. FIG. 5 is a table showing four kinds of voltage setting manners. In FIG. 5, because the voltage $V_{BL1}$ is $+7^{th}$ voltage level for transferring electrical charges equivalent to $\{7C*V_{int}/(C_{BL}+15C)\}$ at time t3, a trimming level is shown as "+7". Furthermore, FIG. 5 recites "GND→$V_{int}$" which sets a terminal of 0 [V] in the initial state to be $V_{int}$ at time t3, "Vint→GND" which sets a terminal of $V_{int}$ in the initial state to be 0 [V] at time t3, and "KEEPING GND" or "KEEPING $V_{int}$" which sets a terminal of GND or $V_{int}$ in the initial state to be constantly a fixed voltage.

As above, in the second embodiment of the present invention, the voltage controller 19 can arbitrarily set the voltages $V_0$ to $V_3$ at the output terminals A0 to A3 even in the initial state. Therefore, the voltage controller 19 may be able to have multiple kinds of voltage setting manners in order to set the first node NBL to be the predetermined voltage level, instead of only one voltage setting manner. Accordingly, the voltage controller 19 can have redundancy to the voltage setting manner without increasing types and capacitance of the capacitors 10 to 13. An advantage obtained by such a redundancy will be described in the following third embodiment of the present invention.

Third Embodiment

Generally, a bit line voltage in reading of a ferroelectric memory has a positive temperature property. When an ambient temperature is high, the bit line voltage in reading becomes high. When an ambient temperature is low, the bit line voltage in reading becomes low. Therefore, the reference voltage generation circuit 1 has to apply a high reference voltage to the first node NBL when the ambient temperature is high and a low reference voltage to the first node NBL when the ambient temperature is low.

A third embodiment of the present invention is related to the reference voltage generation circuit which generates the reference voltage at the first node NBL in consideration of a temperature dependency of the ferroelectric memory, using the redundancy of the voltage setting manner of the voltage controller 19 in the same way as the circuit described in the second embodiment of the present invention.

Figure 6:
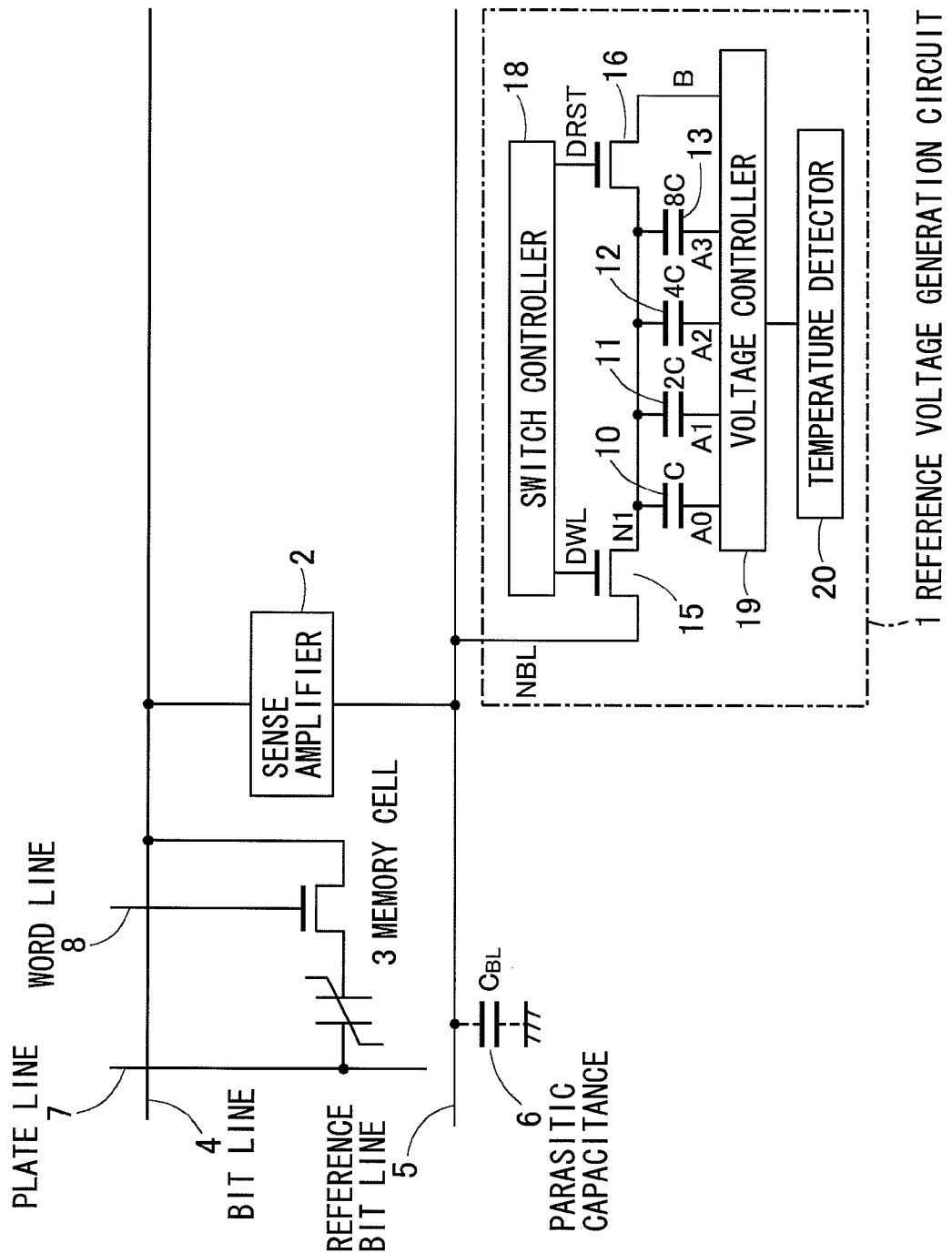
FIG. 6 illustrates a schematic configuration of a ferroelectric memory with a reference voltage generation circuit 1 according to the third embodiment of the present invention.

FIG. 6 illustrates a schematic configuration of a ferroelectric memory with a reference voltage generation circuit 1 according to the third embodiment of the present invention. In FIG. 6, the same reference numerals are attached to parts common to those in FIG. 1. Difference between FIGS. 1 and 6 will be mainly described below.

In the initial state, the voltage controller 19 of FIG. 6 can arbitrarily set any one of the voltages $V_0$ to $V_3$ at the output terminals A0 to A3, like the second embodiment of the present invention. Furthermore, the voltage controller 19 can arbitrarily reset any one of the voltages $V_0$ to $V_3$ at the output terminals A0 to A3 after the second transistor 16 is turned off and the first transistor 15 is turned on.

The reference voltage generation circuit 1 further includes a temperature detector 20 in addition to all the parts in the reference voltage generation circuit 1 of FIG. 1. The temperature detector 20 is a temperature detection circuit using a temperature property of a device such as a diode or a MOS transistor. The temperature detector 20 is provided in the chip including the reference voltage generation circuit 1 and the other. The voltage controller 19 is configured to control the voltages $V_0$ to $V_3$ at the output terminals A0 to A3 on the basis of the ambient temperature (hereinafter, referred to as "temperature information") detected by the temperature detector 20.

The redundant voltage setting described above is important when the reference voltage is varied on the basis of the temperature information. Hereinafter, an example of the reference voltage generation circuit 1 will be explained, in which the reference voltage whose trimming level is +8 is generated at a reference temperature or higher, i.e., at a high temperature, and the reference voltage whose trimming level is +7 is generated at the reference temperature or lower, i.e., at a low temperature. The "trimming level +8" and "trimming level +7" means the eighth and seventh voltage levels from the voltage $V_{BL0}$, respectively.

FIG. 7 illustrates the voltage setting manner to generate the "trimming level +8". As shown in FIG. 7, when the reference voltage whose trimming level is +8 is generated, the voltage setting manner of the voltage controller 19 is limited to only one option. On the other hand, as shown in FIG. 5, when the reference voltage whose trimming level is +7 is generated, the voltage controller 19 can select any one of among four options as the voltage setting manner for the output terminals A0 to A3.

When the voltage controller 19 selects the voltage setting manner of FIG. 5(a), the reference voltage generation circuit 1 reallocates the electrical charges stored in the capacitors 10 to 12 whose capacities are C, 2C, and 4C to generate the reference voltage whose trimming level is +7 (=+1+2+4) at a low temperature. Furthermore, the reference voltage generation circuit 1 allocates the electrical charges stored in the capacitor 13 whose capacitance is 8C to generate the reference voltage whose trimming level is +8 at a high temperature. Therefore, due to variability in a manufacturing process or the like, the voltage levels of the trimming levels +7 and +8 may be reversed when a sum of the capacitances of the capacitors 10 to 12 is higher than the capacitance of the capacitor 13. In this case, there is a likelihood that the reference voltage to be generated at a low temperature may become higher than that at a high temperature.

On the other hand, when the voltage controller 19 selects the voltage setting manner of FIG. 5(b), the reference voltage generation circuit 1 reallocates the electrical charges stored in the capacitors 10 and 13 whose capacities are C and 8C to generate the reference voltage whose trimming level is +7 (=−1+8) at a low temperature. In this case, the trimming level +7 is set as the trimming level +8 by the capacitor 13 and set as the trimming level −1 by the capacitor 10. Therefore, the voltage level of the trimming level +7 always becomes lower than that of the trimming level +8. That is, because the trimming levels +7 and +8 are generated using capacitor 13, there is no likelihood that the trimming levels +7 and +8 is reversed.

As a result, the reference voltage generation circuit 1 can surely generate the reference voltage at a high temperature higher than the reference voltage at a low temperature.

As above, when the trimming level is changed over on the basis of the temperature information, the voltage controller 19 selects an appropriate voltage setting manner in such a manner that the values of the reference voltages at low and high temperatures are not reversed. Therefore, the reference voltage generation circuit 1 can generate the reference voltage in consideration of the temperature dependency.

A variety of control manners according to the voltage controller 19 for controlling the voltages $V_0$ to $V_3$ set to the output terminals A0 to A3 are conceivable. For example, there is a manner using a look up table corresponding to the temperature information acquired from the temperature detector 20. FIG. 8 illustrates that the voltage controller 19 sets the voltages $V_0$ to $V_3$ at the output terminals A0 to A3 using the look up table manner. When the temperature information acquired from the temperature detector 20 indicates the ambient temperature to be the reference temperature or lower, the voltage controller 19 sets $V_{00}=V_{int}$, $V_{01}$=GND, $V_{10}=V_{11}$=GND, $V_{20}=V_{21}$=GND, $V_{30}$=GND, and $V_{31}=V_{int}$ at the outputs terminals A0 to A3 in order to generate the voltage whose trimming level is +7. Furthermore, when the temperature information acquired from the temperature detector 20 indicates the ambient temperature to be the reference temperature or higher, the voltage controller 19 sets $V_{00}=V_{01}$=GND, $V_{10}=V_{11}$=GND, $V_{20}=V_{21}$=GND, $V_{30}$=GND, and $V_{31}=V_{int}$ at the outputs terminals A0 to A3 in order to generate the voltage whose trimming level is +8.

FIG. 8 illustrates only one example of the look up table. For example, the voltage controller 19 can more minutely change over the voltages $V_0$ to $V_3$ to be set at the outputs terminals A0 to A3 on the basis of the temperature. Furthermore, the voltage controller 19 can set the voltage $V_i$ at the output terminal Ai using a manner other than the method using the look up table.

The third embodiment of the present invention has explained the example where the trimming levels are changed over at low and high temperatures. However, the change-over of the reference voltage is not limited to only these 2 levels. For example, the trimming level can be changed over per ten degrees change in temperature.

In the third embodiment of the present invention, the voltage setting manner of the voltage controller 19 has redundancy to set the reference voltage level at the first node NBL, and the voltage controller 19 selects the optimum voltage setting manner on the basis of the temperature information acquired from the temperature detector 20. Therefore, the reference voltage generation circuit 1 can generate the appropriate reference voltage in consideration of temperature dependence of the memory cell 3.

In the above embodiments of the present invention described above, the reference voltage generation circuit has been explained to set the voltage of the reference bit line of the semiconductor memory such as a ferroelectric memory. However, the reference voltage generation circuit of the present invention can be applied to various purposes other than the purpose setting the voltage of the reference bit line. For example, the present invention is applicable to a variety of apparatuses using the reference voltage as reference and is not necessarily used for the semiconductor memory.

All the reference voltage generation circuit according to the present invention can be formed on one semiconductor substrate or a part of the circuit can be formed on the other semiconductor substrate. Furthermore, the reference voltage generation circuit according to the present invention may be implemented on a printed board, using discrete parts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reference voltage generation circuit comprising:
   a first node settable at a first voltage to be any one of a plurality of voltage levels;
   a second node configured to be set at a second voltage;
   first and second switches connected in series between the first and second nodes;
   a plurality of capacitors, each capacitor comprising a first and second end, the first end of each capacitor connected to a connection node between the first and second switches, the second end of each capacitor settable at a voltage level independent of a voltage level set at the second end of each other capacitor;
   a switch controller configured to turn off the first switch and turn on the second switch in an initial state, and then to turn off the second switch and to turn on the first switch; and
   a voltage controller configured to individually set the voltage at the second end of each of the plurality of capacitors after the first switch is turned on.

2. The circuit of claim 1, wherein the voltage controller is configured to
   set the second ends of the plurality of capacitors to be the same voltage level as an initial voltage in the initial state, and
   after the first switch is turned on, individually set the voltages at the second ends of the plurality of capacitors.

3. The circuit of claim 1, wherein the voltage controller is configured to individually set the voltages at the second ends of the plurality of capacitors in the initial state, and later individually set the voltages at the second ends of the plurality of capacitors.

4. The circuit of claim 1, further comprising a temperature detector configured to detect an ambient temperature, wherein
   the voltage controller is configured to set the voltages at the second ends of the plurality of capacitors based on a detection result of the temperature detector.

5. The circuit of claim 2, further comprising a temperature detector configured to detect an ambient temperature, wherein
   the voltage controller is configured to set the voltages at the second ends of the plurality of capacitors based on a detection result of the temperature detector.

6. The circuit of claim 3, further comprising a temperature detector configured to detect an ambient temperature, wherein
   the voltage controller is configured to set the voltages at the second ends of the plurality of capacitors based on a detection result of the temperature detector.

7. The circuit of claim 4, wherein the voltage controller selects a voltage setting manner in order to prevent a value of the first voltage from being reversed between the first voltage in which the detection result is higher than a reference temperature and the first voltage in which the detection result is lower than the reference temperature.

8. The circuit of claim 4, wherein the voltage controller selects a voltage setting manner based on a predetermined temperature range.

9. The circuit of claim 1, wherein the second voltage is an arbitrary pre-charge voltage.

10. A semiconductor memory comprising:
    a memory cell; and
    a reference voltage generation circuit configured to generate a voltage for the memory cell, wherein
    the reference voltage generation circuit comprises:
       a first node settable at a first voltage to be any one of a plurality of voltage levels;
       a second node configured to be set at a second voltage;
       first and second switches connected in series between the first and second nodes;
       a plurality of capacitors, each capacitor comprising a first and second end, the first end of each capacitor connected to a connection node between the first and second switches, the second end of each capacitor settable at a voltage level independent of a voltage level set at the second end of each other capacitor;
       a switch controller configured to turn off the first switch and turn on the second switch in an initial state, and then to turn off the second switch and to turn on the first switch; and
       a voltage controller configured to individually set the voltage at the second end of each of the plurality of capacitors after the first switch is turned on.

11. The memory of claim 10, wherein the voltage controller is configured to
    set the second ends of the plurality of capacitors to be the same voltage level as an initial voltage in the initial state, and
    after the first switch is turned on, individually set the voltages at the second ends of the plurality of capacitors.

12. The memory of claim 10, wherein the voltage controller is configured to individually set the voltages at the second ends of the plurality of capacitors in the initial state, and then individually set the voltages at the second ends of the plurality of capacitors.

13. The memory of claim 10, further comprising a temperature detector configured to detect an ambient temperature, wherein
    the voltage controller is configured to set the voltages at the second ends of the plurality of capacitors based on a detection result of the temperature detector.

14. The memory of claim 11, further comprising a temperature detector configured to detect an ambient temperature, wherein
    the voltage controller is configured to set the voltages at the second ends of the plurality of capacitors based on a detection result of the temperature detector.

15. The memory of claim 12, further comprising a temperature detector configured to detect an ambient temperature, wherein
    the voltage controller is configured to set the voltages at the second ends of the plurality of capacitors based on a detection result of the temperature detector.

16. The memory of claim 13, wherein the voltage controller selects a voltage setting manner in order to prevent a value of the reference voltage from being reversed between a reference voltage in which the detection result is higher than a reference temperature and a reference voltage in which the detection result is lower than the reference temperature.

17. The memory of claim 13, wherein the voltage controller selects a voltage setting manner based on a predetermined temperature range.

18. The memory of claim 10, wherein the voltage controller is configured to set an arbitrary pre-charge voltage at the second end of each the capacitor.

19. The memory of claim 10, further comprising:
a first bit line connected to the memory cell;
a second bit line; and
a sense amplifier, wherein
the reference voltage generation circuit generates the first voltage applied to the first bit line; and
the sense amplifier compares a voltage of the second bit line with the first voltage to sense data read out from the memory cell via the second bit line.

20. A reference voltage generation circuit comprising:
a first node settable at a first voltage to be any one of a plurality of voltage levels;
a first switch connected to the first node;
a plurality of capacitors, each capacitor comprising a first and second end, the first end of each capacitor connected to a connection node connected to the first switch, the second end of each capacitor settable at a voltage level independent of a voltage level set at the second end of each other capacitor;
a switch controller configured to turn off the first switch in an initial state, and then to turn on the first switch; and
a voltage controller configured to individually set the voltage at the second end of each of the plurality of capacitors after the first switch is turned on.

* * * * *